United States Patent [19]

Lyle

[11] Patent Number: 5,296,814
[45] Date of Patent: Mar. 22, 1994

[54] TUNABLE SIGNAL COUPLER FOR A MAGNETIC RESONANCE IMAGING SYSTEM

[75] Inventor: David E. Lyle, Brookfield, Wis.

[73] Assignee: General Electric Company, Milwaukee, Wis.

[21] Appl. No.: 869,270

[22] Filed: Apr. 15, 1992

[51] Int. Cl.$^5$ .............................. G01R 33/20
[52] U.S. Cl. .................................... 324/322
[58] Field of Search .............. 324/300, 307, 309, 310, 324/311, 312, 313, 314, 318, 322; 128/653.5; 333/221, 231, 245

[56] References Cited

U.S. PATENT DOCUMENTS

| | | | |
|---|---|---|---|
| 4,712,067 | 12/1987 | Roschmann et al. | 324/318 |
| 4,712,069 | 12/1987 | Kemner et al. | 324/322 |
| 4,751,465 | 6/1988 | Zens | 324/322 |
| 4,766,383 | 8/1988 | Fox et al. | 324/318 |
| 4,887,039 | 12/1989 | Roemer et al. | 324/322 |
| 4,916,398 | 4/1990 | Rath | 324/322 |
| 4,928,064 | 5/1990 | Keren | 324/322 |
| 4,992,736 | 2/1991 | Stormont et al. | 324/309 |
| 5,081,418 | 1/1992 | Hayes et al. | 324/322 |

Primary Examiner—Michael J. Tokar
Attorney, Agent, or Firm—Quarles & Brady

[57] ABSTRACT

A device for coupling a radio frequency transceiver of an MRI system utilizes a tunable hybrid network. The network is formed of fixed value capacitors connected to transmission lines that provide inductive reactance to the network. The connection of the components is such that an input signal applied to one node produces a pair of signals in quadrature at two other nodes. In order to insure that the pair of signals have the proper phase and amplitude relationship a fixed capacitor is connected across specific pairs of the transmission lines. The point of connection of that capacitor to the transmission lines is chosen to properly tune the network.

16 Claims, 2 Drawing Sheets

TUNABLE SIGNAL COUPLER FOR A MAGNETIC RESONANCE IMAGING SYSTEM

BACKGROUND OF THE INVENTION

The present invention relates to magnetic resonance imaging (MRI) systems; and more particularly to devices which couple a radio frequency antenna to transmitter and/or receiver circuits in the system.

Magnetic resonance has been developed as an imaging method useful in diagnostic medicine. In magnetic resonance imaging (MRI), a body being imaged, such as a medical patient, is held within a uniform magnetic field oriented along a Z axis of a Cartesian coordinate system. Magnetic gradient fields $G_x$, $G_y$ and $G_z$ are applied along the X, Y and Z axes to impress position information onto the MRI signals through phase and frequency encoding.

The net magnetizations of the nuclei in the body then are excited to precession by a radio frequency (RF) pulse that is applied through a switch and a coupler to an antenna located adjacent the object being imaged. The coupler splits the RF pulse into two signals I and Q in quadrature which are coupled to the antenna. In some instances the RF pulse is used to excite nuclei throughout most of the body, in which case the antenna is relatively large and can consume 2.5 KW of power, for example. In other instances a smaller antenna is used to excite nuclei in only a portion of the body, the head of a patient for example. In this latter case the small antenna is placed locally about that portion and requires less power.

The decaying precession of the spinning nuclei produces the MRI signal, which has an amplitude that is dependent, among other factors, on the number of precession nuclei per volume within the image body, termed the "spin density." The MRI signal induces two quadrature signals in the antenna. In the receiving mode, the signals from the antenna are switched from the coupler to a receiver.

The excitation and signal reception modes are repeated to acquire a number of "views", a view being defined as one or more MRI signal acquisitions made under the same X and Y gradient fields. The views then are processed to reconstruct an image of the object.

Conventional couplers for the RF antenna were quadrature hybrid devices comprising four one-quarter wavelength transmission lines connected as sides of a square network. In the excitation mode, the RF signal was applied to one corner of the square network and the outputs for the I and Q signals were at the next two adjacent corners, respectively. Each input and output of the network had the same impedance (e.g. 50 ohms). An equivalent "dummy load" impedance was connected to the fourth corner of the network. Two MRI systems employ an RF excitation signal having center frequencies of 21.3 MHz. or 63.86 MHz., depending upon the strength of the magnetic field. For a 21.3 MHz. excitation signal, each transmission line had to be approximately ninety inches (228 cm) long, whereas a thirty inch (76 cm) transmission line is required at 63.86 MHz. For these transmission line lengths, the enclosure for the coupler becomes extremely large. In the reception mode, the receiver was coupled to the fourth corner of the network in place of the dummy load and another dummy load was connected to the one corner instead of the excitation signal.

A quadrature hybrid network using lumped elements can be substituted for the transmission line network described above. One form of such a hybrid network comprises a set of capacitors connected in a square with each corner being connected to ground potential by an inductor formed by a relatively short transmission line. The signals are applied to and fed from the corners of the network. However, in this type of network the values of the inductive reactance and capacitance must be very precise or variable to properly balance the network. An imbalanced network will not produce excitation output signals that are exactly ninety degrees out of phase or of unequal amplitude. Unequal or out of quadrature signals adversely affect the nuclei excitation and the subsequent acquisition of MRI signals. An imbalanced network conversely affects the reception of signals from the antenna. Although variable capacitors theoretically could be used, thus making the coupling network tunable, the power levels dictate very large and bulky capacitors and such devices are prone to arcing.

SUMMARY OF THE INVENTION

A magnetic resonance imaging system has a transceiver which produces a radio frequency signal for exciting the nuclei in a body being imaged. The transceiver also receives MRI signal from the body which are processed by other system components to reconstruct an image of the body.

The transceiver is connected to an antenna by a hybrid coupler formed by capacitors and transmission lines connected in a network. In the excitation mode, the radio frequency signal is applied to one node of the network and two signals in quadrature are produced at two other nodes. The two other nodes are connected to the antenna. In the receiving mode, signals from the antenna are received at the two other nodes and a composite signal is produced at a fourth node that is connected to a receiver circuit in the transceiver. The present coupler also can be used to couple only a transmitter or only a receiver to the antenna.

The coupler must be tuned to the radio frequency signal in order to properly produce the quadrature signals in the excitation mode and to produce the composite signal in the receiving mode. The tuning is accomplished by a capacitor connected across a pair of transmission lines in the network. The precise point of connection tunes the network and is variable for that purpose.

One embodiment of the present coupler utilizes first and second transmission lines with a capacitor connected across one end of each transmission line. The radio frequency excitation signal from the transceiver is applied to the one end of said first transmission line and the one end of the second transmission line is connected to the receiver. The two quadrature signals are produced at the other ends of the transmission lines which are connected to the antenna. Another capacitor is connected across said first and second transmission lines at an intermediate point between their ends to tune the circuit to the given radio frequency.

A second embodiment of the present invention employs four transmission lines and is able to apply more power from the transceiver to the antenna. In this coupler four capacitors are connected serially in a ring and a separate transmission line is connected at one end to a different node between the capacitors. In the preferred version of this coupler the other ends of the transmission lines are connected to ground potential, although other fixed electrical potentials could be used.

The radio frequency signal from the transceiver is applied to one node of the second embodiment and the two quadrature signals are produced at the next two nodes around the ring. The receiver is connected to the remaining node. A first tuning capacitor is connected across two of the transmission lines and a second tuning capacitor is connected across the other two transmission lines. The tuning capacitors are connected at points between the ends of the respective transmission lines which tune the network to the radio frequency.

An object of the present invention is to provide a tunable lumped element hybrid radio frequency signal coupler for a magnetic resonance imaging system.

DESCRIPTION OF THE PRESENT INVENTION

Figure 1:
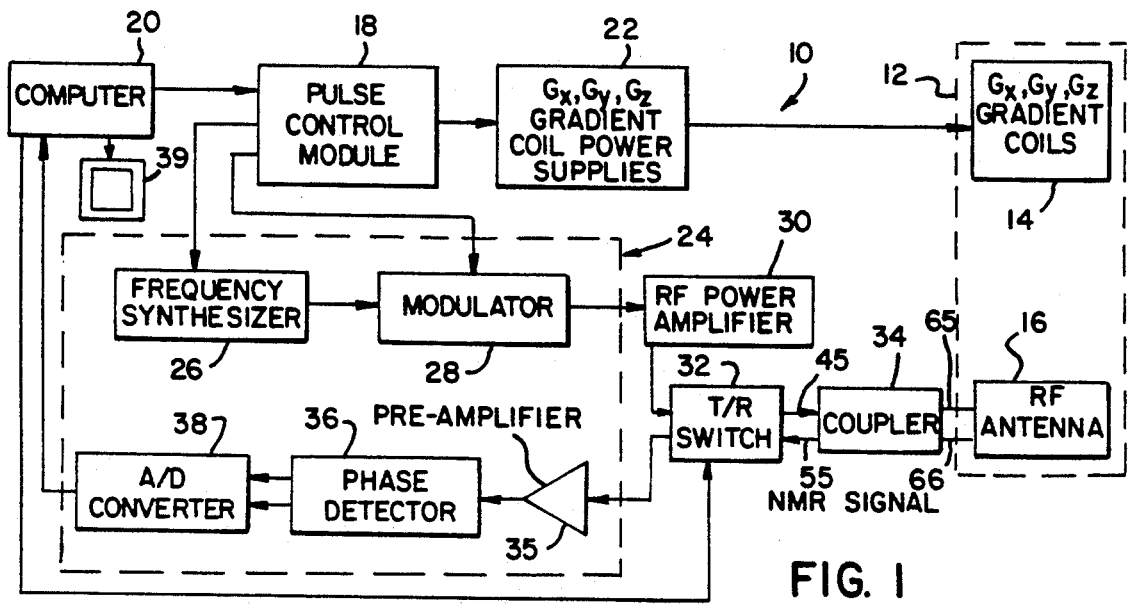
FIG. 1 is a block diagram of an exemplary MRI system incorporating the present invention.

With initial reference to FIG. 1, an MRI system 10 includes a magnet assembly 12 formed by a plurality of super conducting electromagnet coils enclosed in a conventional, cylindrical cryostat chamber. The magnet assembly 12 has a tubular shape about a longitudinal axis defining an interior volume within which a medical patient, for example, is placed for imaging. A main field coil (not shown) is provided in the magnet assembly 12 to create a uniform static magnetic field oriented along the longitudinal axis. The assembly also includes a trio of gradient coils 14 aligned to produce fields within the interior volume along each axis of a Cartesian coordinate system. A radio frequency antenna 16 is located in magnet assembly 12.

The control circuitry for the MRI system 10 comprises a pulse control module 18 which provides properly timed pulse sequences under the control of a computer 20. The pulse control module 18, in turn, governs gradient power supplies 22 which drive the three gradient coils 14 to produce the magnetic field gradients $G_x$, $G_y$ and $G_z$ within magnet assembly 12.

The pulse control module 18 controls a radio frequency (RF) synthesizer 26 that is part of an RF transceiver, portions of which are enclosed by dashed line block 24. The pulse control module 18 also operates a modulator 28 that receives the RF output from synthesizer 26 and supplies a modulated signal to a power amplifier 30. Components 26 and 28 form a transmitter section of the transceiver 24 and are described in more detail in U.S. Pat. No. 4,952,877 which is incorporated by reference herein.

During the excitation mode of operation, the amplified RF signal is applied to the antenna 16 through transmit/receive (T/R) switch 32 and coupler 34. The coupler splits the transmitter signal from the power amplifier 30 into two signals I and Q that differ in phase by 90°, i.e. two signals in quadrature. The I and Q signals are applied to the antenna 16 to produce a pair of varying magnetic fields that also are in quadrature. These latter two fields excite the spinning of nuclei in the patient being imaged. U.S. Pat. No. 4,887,039 describes one type of an antenna for this purpose.

After exciting the nuclei with an RF pulse, the transmit/receive switch 32 is activated by computer 20 to disconnect the transmitter section from coupler 34 and connect the coupler to the receiver section of the transceiver 24. In this mode of operation, the MRI signals from the excited nuclei are picked up by the antenna 16 and applied to a receiver preamplifier 35 through coupler 34 and the transmit/receive switch 32. The output of the preamplifier 35 is coupled to the input of a quadrature phase detector 36. The detected signals are digitized by a high speed analog-to digital (A/D) converter 38 and fed to computer 20. The computer employs well known techniques which process the received signals and produce MRI images of the patient on display 39. The receiver section is described in more detail in U.S. Pat. No. 4,992,736, which is incorporated herein by reference.

Figure 2:
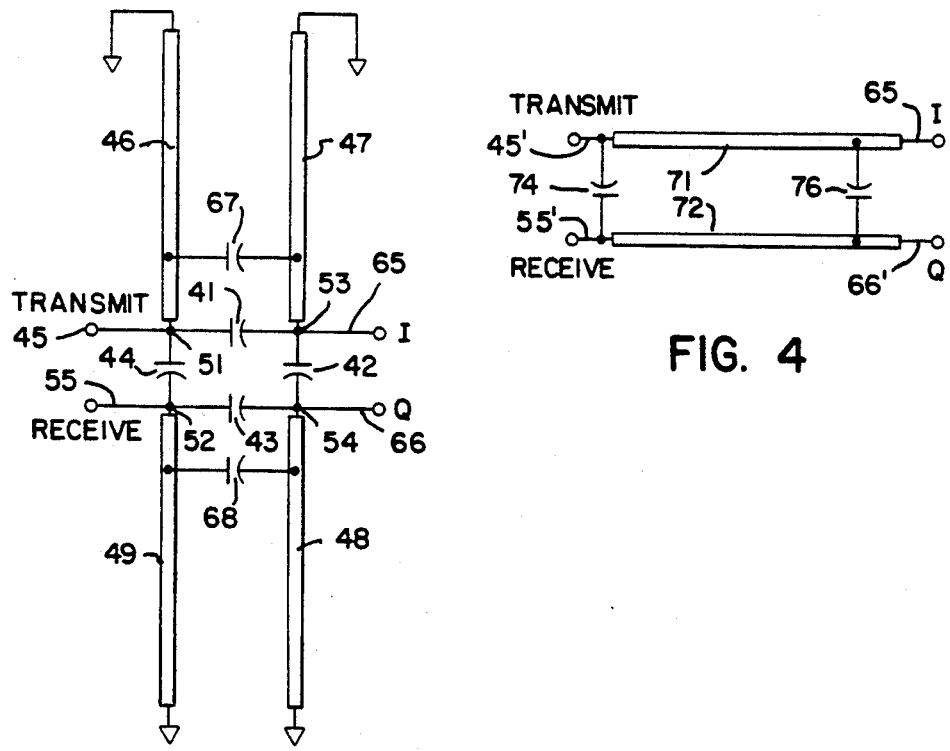
FIG. 2 shows a lumped element coupler according to the present invention.

The MRI system 10 utilizes a unique RF coupler 34, one embodiment of which for use with a full body antenna consuming 2.5 KW of power is shown in FIGS. 2. Exemplary values for the components of this network will be provided for a coupler tuned to a 21.3 MHz. signal. The hybrid network has four capacitors 41, 42, 43 and 44 connected in a ring with each one having a fixed capacitance of 150 picofarads. One skilled in lumped element arrays will recognize that capacitors 41 and 43 of a conventional non-tunable network would have an ideal capacitance of about 211 picofarads. In the present hybrid coupler, capacitors 41 and 43 are approximately three-fourths the ideal value of corresponding capacitors in a conventional network. Further, the tunability also permits the use of capacitance that deviates from precisely this fraction of the ideal value. A separate transmission line 46, 47, 48 or 49 is connected at one end to a different node between two of the capacitors 41–44. The other end of each transmission line is connected to ground potential. The transmission lines 46–49 act as inductors in the lumped element network of the coupler 34 and provide an inductive reactance ($X_L$) of 20.71 ohms, in this example.

The node 51 between capacitors 41 and 44 in the hybrid network is connected by conductor 45 to the transmitter output from the transmit/receive switch 32. During the mode when the nuclei are being excited, node 51 receives the RF signal from the power amplifier 30 over conductor 45, and during the receive mode, the transmit/receive switch 32 couples a dummy load to node 51. The node 52 between capacitors 43 and 44 in the hybrid network is connected by conductor 55 and the transmit/receive switch 32 to the input of preamplifier 35 in the transceiver 24 when the system is receiving MRI signals from the body. In the nuclei excitation mode, the transmit/receive switch 32 couples a dummy load to node 52. The I and Q signals are produced at nodes 53 and 54, respectively, on either side of capacitor 42 and are applied via conductors 65 and 66 to coils within the antenna 16.

Figure 3:
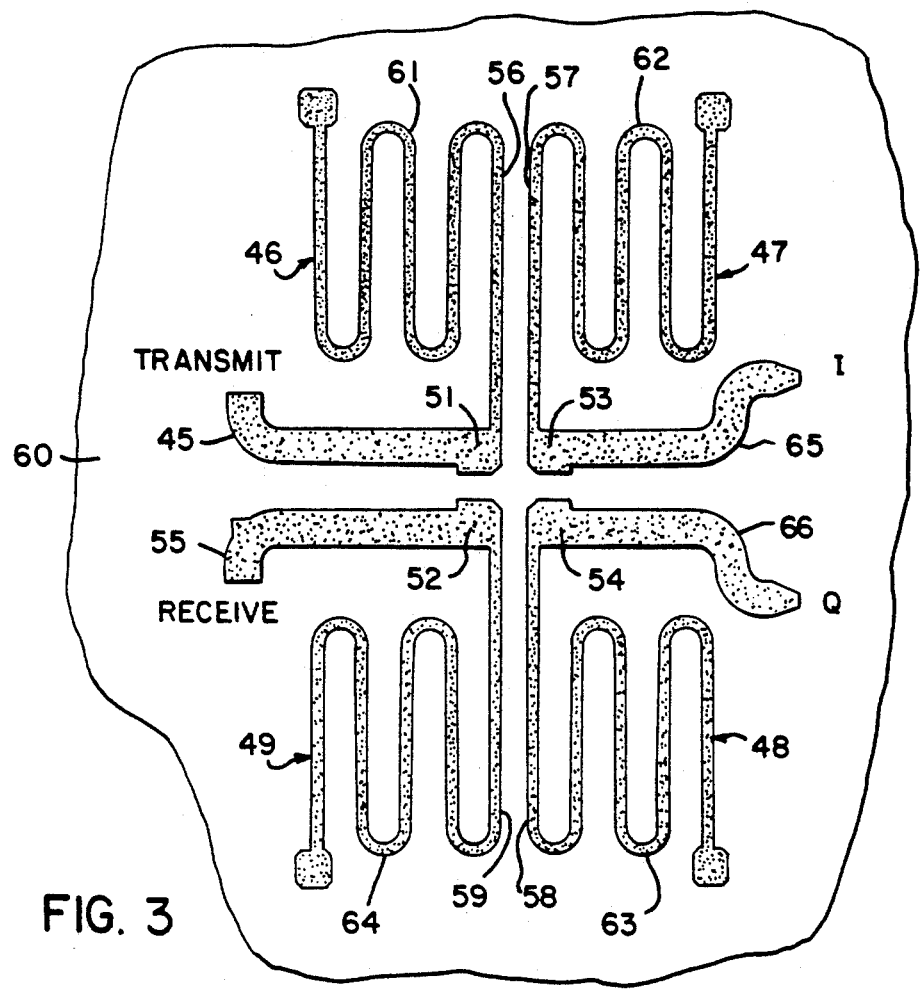
FIG. 3 illustrates a printed circuit board pattern for the coupler in FIG. 2.

The four transmission lines 46–49 and conductors 45, 55, 65 and 66 preferably are fabricated on a printed circuit board 60, the conductive pattern of which is shown in FIG. 3. The coupler 34 can be located on the same printed circuit board as the transmit/receive switch 32. Because of the radio frequencies involved the coupler must be enclosed in a shielded housing (not shown) to prevent undesired RF radiation. Each transmission line 46, 47, 48 and 49 has a straight section 56, 57, 58 and 59, respectively, emanating from the corresponding node 51, 53, 54 and 52. The straight sections 56, 57, 58 and 59 connect into separate serpentine sections 61, 62, 63 and 64, respectively, which forms the remainder of each transmission line and creates the necessary inductive reactance. Because of the hybrid nature of the coupling network the length of each transmission line 46–49 is considerably shorter than previous couplers 34 that used only transmission lines. Capacitors 41–44 are soldered across the pads which form the nodes of the conductive pattern.

As noted previously the inductance and capacitance of the elements of the quadrature hybrid coupler 34 must be closely toleranced in order to accurately split the excitation signal in the transmit mode and combine the I and Q signals into MRI signals in the receive mode. Even with printed circuit transmission lines minor differences between circuit board varies the inductive reactance and may adversely affect the operation of the coupler 34. Therefore, as shown in FIG. 2, a first fixed value tuning capacitor 67 is placed across transmission lines 46 and 47, basically in parallel with capacitor 41. In addition, a second tuning capacitor 68 is placed across transmission lines 48 and 49, basically in parallel with capacitor 43. However, the intervening section of the transmission lines between capacitors 41 and 67 and between capacitors 43 and 68 results in each pair of capacitors truly not being electrically in parallel. For example, both tuning capacitors have a value of 82 picofarads. In the printed circuit of FIG. 3, the first tuning capacitor 67 is soldered between the straight sections 56 and 57, which extend substantially parallel to one another, while the second tuning capacitor 68 is soldered between the straight sections 58 and 59, which also extend substantially parallel. The initial position of the two tuning capacitors 67 and 68 is rather arbitrary, although experience in tuning the particular coupler provides an estimate of the initial position.

To tune the hybrid coupler 34, a signal at the desired center frequency (e.g. 21.3 MHz.) is applied to the transmit input conductor 45. A network analyzer is use to measure the phase relationship and the amplitude of the signals between the transmit conductor 45 and each of the I and Q signal conductors 65 and 66. Any unused ports of the network are terminated by a dummy load. From the resultant measurements the tuning capacitors 67 and 68 are unsoldered and reattached along the straight sections 56/57 and 58/59 to balance the I and Q output signals. If the I output signal has greater loss that the Q output signal, the tuning capacitors 67 and 68 are repositioned closer to the center of the network. Similarly, when the Q output signal has greater loss that the I output signal, the tuning capacitors 67 and 68 are moved outward. An table relating the loss to movement distance can be created empirically as an aid in tuning the coupler 34 in this manner. As such a table is dependent on the specific physical design of the printed circuit and component values, an exemplary table is not being provided here.

Figure 4:
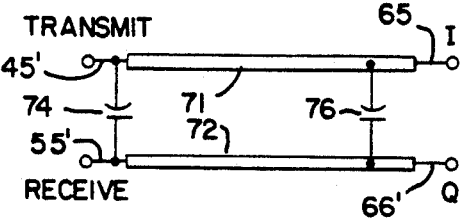
FIG. 4 shows an alternative lumped element coupler.

With reference to FIG. 4, an alternative design for a hybrid network to be used in coupler 35 for a small antenna, such as a "head coil," consuming on the order of 250 watts of RF power. This coupler incorporates two transmission lines 71 and 72 having lengths that are approximately one-eighth the wavelength of the excitation signal. One end of the first transmission line 71 is connected via the transmitter conductor 45' to the transmit/receive switch 32, and one end of the second transmission line 72 is connected by the receiver conductor 55' to the transmit/receive switch. A fixed value capacitor 74 is connected across these ends of the two transmission lines 71 and 72 and a fixed value tuning capacitor 76 is connected between the transmission lines 71 and 72 near their other ends.

The other end of the first transmission line 71 produces the I output signal and is connected by conductor 65' to the appropriate terminal point of antenna 16. The other end of the second transmission line 72 produces the Q output signal which is in quadrature phase relationship to the I output signal. The other end of the second transmission line 72 similarly is connected by conductor 66' to the appropriate terminal point of the antenna 16.

Figure 5:
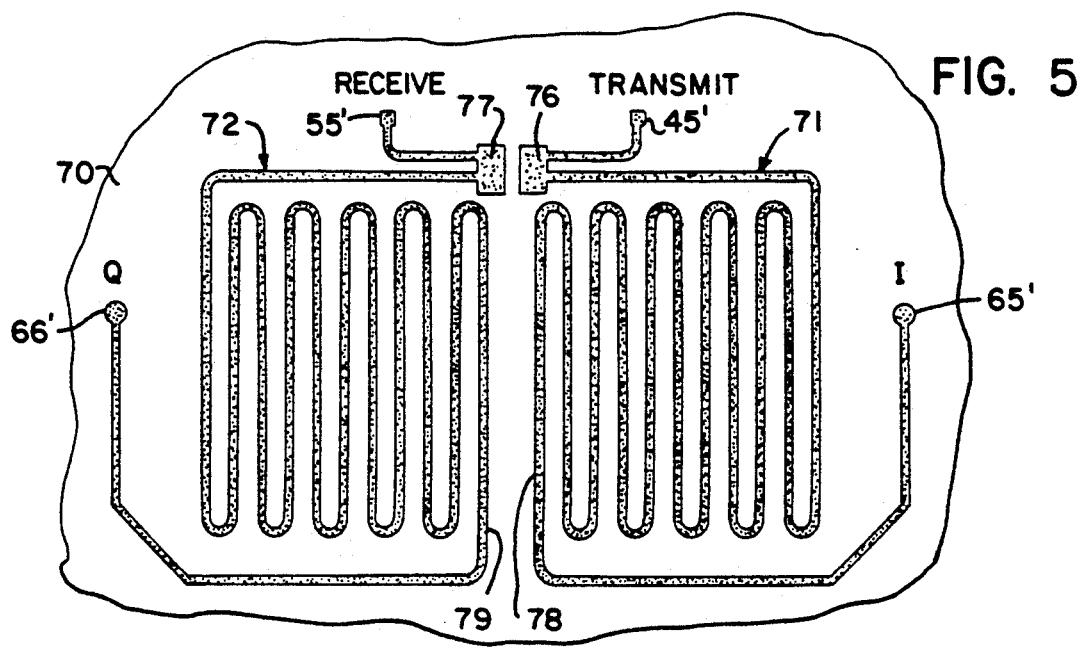
FIG. 5 illustrates a printed circuit board pattern for the coupler in FIG. 4.

FIG. 5 illustrates the conductive pattern of a printed circuit board 70 that is preferably utilized to fabricate the second embodiment of the hybrid coupler illustrated in FIG. 4. The transmit and receive conductors 45 and 55 connect to pads 76 and 77 forming nodes across which capacitor 74 is to be mounted. Capacitor 74 is 150 picofarads, for example. The conductive pads 76 and 77 also connect to serpentine sections of the transmission lines 71 and 72 which provide the appropriate inductive reactance for the hybrid network. At the opposite end of the serpentine sections of the transmission lines 71 and 72 are substantially parallel, straight sections 78 and 79, respectively.

The tuning capacitor 76 is mounted along these straight sections 78 and 79 at an appropriate location which tunes the hybrid network. For example, the tuning capacitor has a value of 150 picofarads. The exact position of the tuning capacitor determines the effective length of the transmission lines 71 and 72. A similar method as described above with respect to the first embodiment, is utilized to tune the second hybrid network shown in FIGS. 4 and 5. In summary, the tuning capacitor 76 is soldered at different locations along the straight sections 78 and 79 of the transmission lines until the I and Q signals have substantially equal amplitudes and are in quadrature.

The invention being claimed is:

1. A circuit for coupling a transmitter of a magnetic resonance imaging system to an antenna, said circuit comprising:
   first and second transmission lines with each transmission line having two ends;
   a first capacitor connected across first ends of said first and second transmission lines;
   a first conductor for coupling a signal at a given radio frequency from the transmitter to the first end of said first transmission line;
   a second capacitor connected across said first and second transmission lines at an intermediate point between the ends of each transmission line, the point being chosen to tune the circuit to the given radio frequency; and
   a second conductor for connecting the antenna to an end of the second transmission line.

2. The circuit as recited in claim 1 wherein said first and second transmission lines have substantially identical electrical length.

3. The circuit as recited in claim 3 wherein said second conductor connects the antenna to a second end of said second transmission line that is remote from the first end.

4. The circuit as recited in claim 4 further comprising a fourth conductor for connecting a receiver to the first end of said second transmission line.

5. The circuit as recited in claim 3 further comprising a third conductor for connecting the antenna to a second end of said first transmission line.

6. The circuit as recited in claim 1 wherein the point at which said second capacitor is connected is closer to second ends of said first and second transmission lines than to the first ends.

7. The circuit as recited in claim 1 wherein said first and second transmission lines are formed as serpentine conductive patterns on a printed circuit board; and said second capacitor is electrically connected to the conductive patterns.

8. A circuit for coupling a transceiver of a magnetic resonance imaging system to an antenna, said circuit comprising:
   first, second, third and fourth capacitors connected serially in a ring having nodes between adjacent capacitors
   first, second, third and fourth transmission lines each having a first end connected to a different node and a second end to which a fixed electrical potential is applied;
   a first conductor for coupling a signal at a given radio frequency from the transceiver to the node between the first and fourth capacitors;
   conductive elements for connecting the antenna to the node between the first and second capacitors and to the node between the second and third capacitors;
   a second conductor for connecting a receiver section of the transceiver to the node between the third and fourth capacitors;
   a first tuning capacitor connected across said first and second transmission lines at intermediate points between the ends of those transmission lines, the points being chosen to tune the circuit to the given radio frequency; and
   a second tuning capacitor connected across said third and fourth transmission lines at intermediate points between the ends of those transmission lines, the points being chosen to tune the circuit to the given radio frequency.

9. The circuit as recited in claim 8 wherein each of said first, second, third and fourth capacitors have substantially identical capacitance.

10. The circuit as recited in claim 8 wherein said first and third capacitors have substantially identical capacitance; and said second and fourth capacitors have substantially identical capacitance.

11. The circuit as recited in claim 8 wherein said first and second tuning capacitors have substantially identical capacitance.

12. The circuit as recited in claim 8 wherein said first, second, third and fourth transmission lines have substantially identical inductive reactance.

13. The circuit as recited in claim 8 wherein said first, second, third and fourth transmission lines are formed as conductive patterns on a printed circuit board.

14. The circuit as recited in claim 13 wherein each of said first, second, third and fourth transmission lines includes a serpentine conductive pattern.

15. The circuit as recited in claim 13 wherein the conductive pattern of said first transmission line has a section that is substantially parallel to a section of the conductive pattern of said second transmission line, across which sections the first tuning capacitor is electrically connected; and the conductive pattern of said third transmission line has a portion that is substantially parallel to a portion of the conductive pattern of said fourth transmission line, across which portions the second tuning capacitor is electrically connected.

16. The circuit as recited in claim 8 wherein the points at which said first tuning capacitor is connected is closer to the first ends of said first and second transmission lines than to the second ends; and the points at which said second tuning capacitor is connected is closer to the first ends of said third and fourth transmission lines than to the second ends.

* * * * *